United States Patent [19]
Uchio et al.

[11] Patent Number: 5,893,633
[45] Date of Patent: Apr. 13, 1999

[54] LIGHT-EMITTING APPARATUS AND METHOD OF PRODUCING THE SAME

[75] Inventors: Masatoshi Uchio, Fukushima-ken; Junichi Saito, Miyagi-ken; Kazuyoshi Yamagata, Fukushima-ken, all of Japan

[73] Assignee: Alps Electric Co., Ltd., Tokyo, Japan

[21] Appl. No.: 08/759,651

[22] Filed: Dec. 6, 1996

[30] Foreign Application Priority Data

Dec. 13, 1995 [JP] Japan ................. 7-324735

[51] Int. Cl.⁶ .................................................. F21V 5/04
[52] U.S. Cl. .................... 362/244; 362/240; 362/249; 362/267; 362/800; 313/500
[58] Field of Search .................. 313/500, 501, 313/510, 512; 362/226, 227, 249, 800, 267, 240, 244

[56] References Cited

U.S. PATENT DOCUMENTS

| | | | |
|---|---|---|---|
| 3,876,900 | 4/1975 | Amatsuka et al. | 313/510 |
| 4,935,665 | 6/1990 | Murata | 313/500 |
| 5,101,326 | 3/1992 | Roney | 362/249 |
| 5,325,271 | 6/1994 | Hutchisson | 313/500 |
| 5,585,783 | 12/1996 | Hall | 362/800 |
| 5,750,974 | 5/1998 | Sasaki et al. | 235/454 |

Primary Examiner—Alan Cariaso
Attorney, Agent, or Firm—Brinks Hofer Gilson & Lione

[57] ABSTRACT

A light emitting device including a base with five planar surface sections formed at five different angles, with a plurality of receiving holes, which are spaced apart, passing through the planar surface sections; light-emitting diode chips mounted at about the center of their respective planar surface sections with a conductive paste such that they emit light in a direction perpendicular to the plane of their respective planar surface sections; terminals inserted into their respective receiving holes, with one end of each terminal being electrically connected to the corresponding LED chip; and a mold case which covers each LED chip.

9 Claims, 13 Drawing Sheets

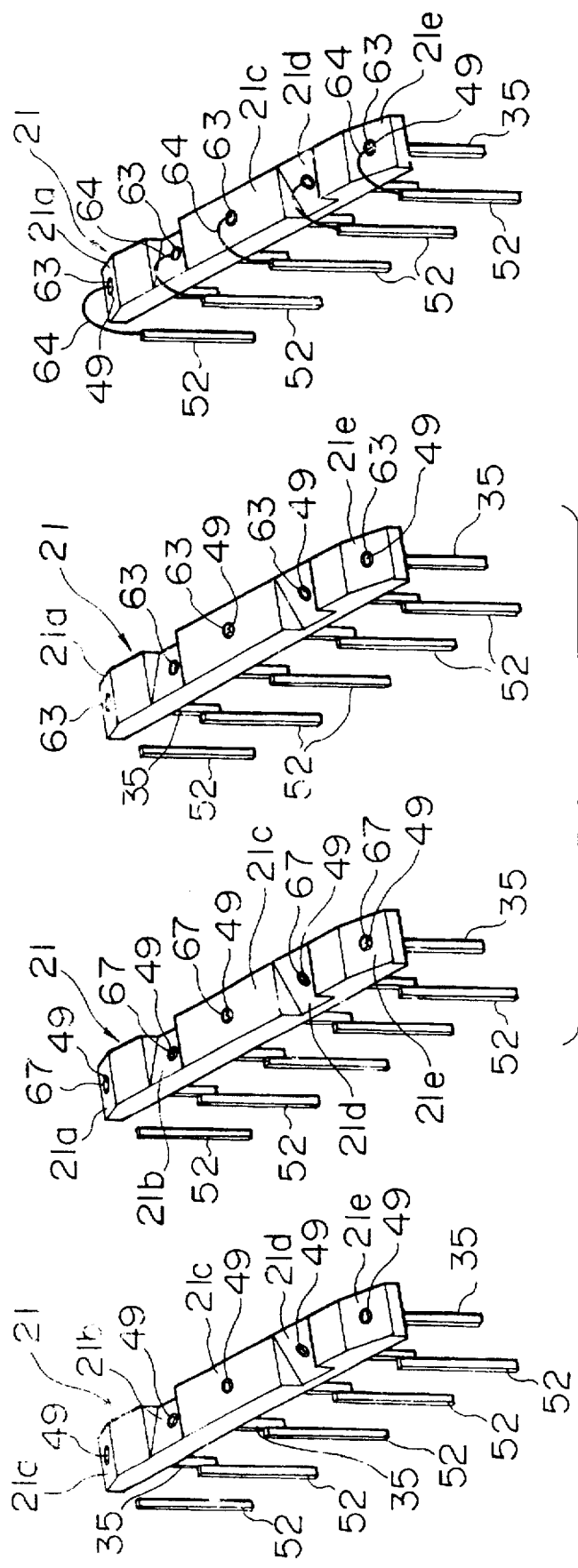

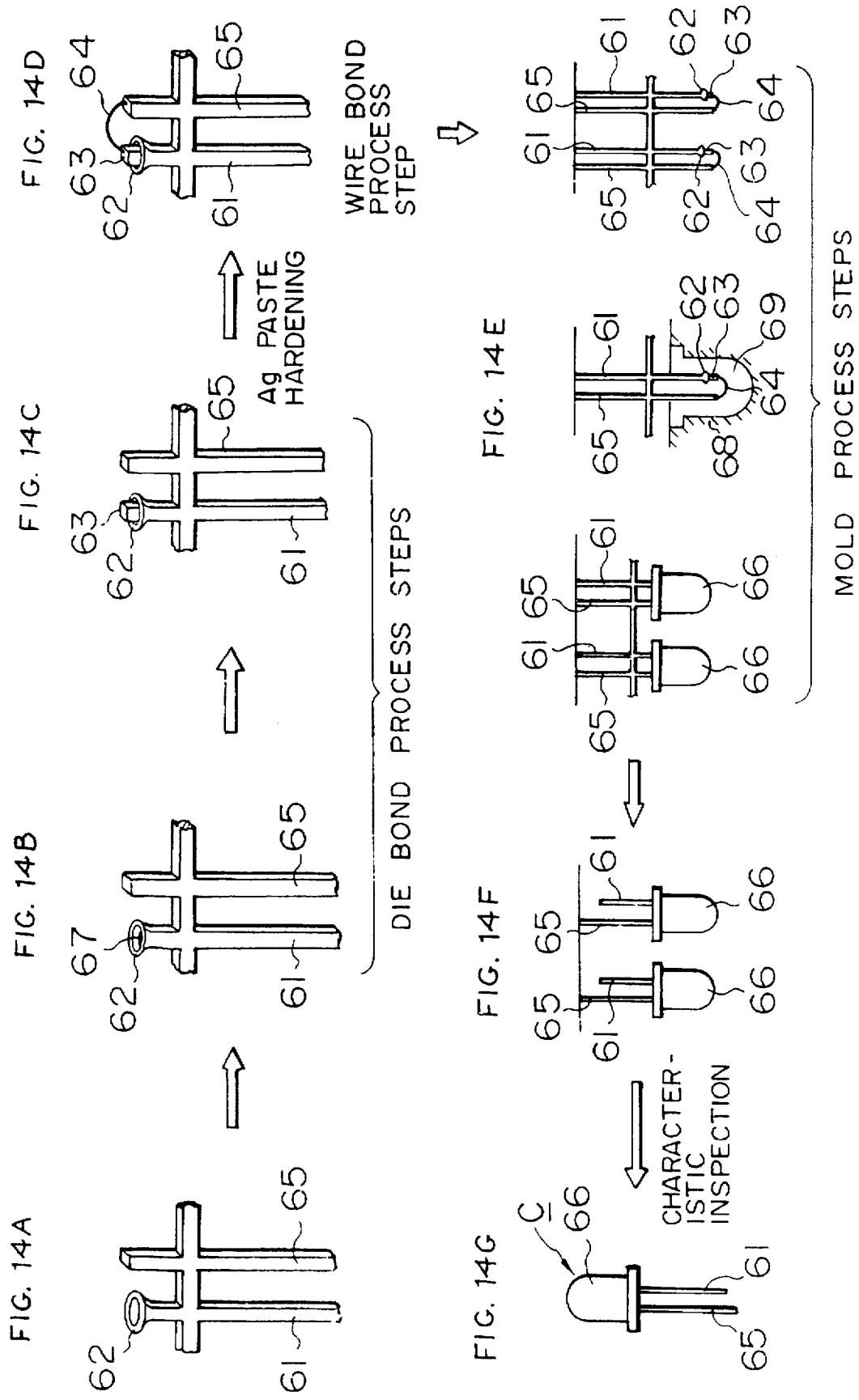

LIGHT-EMITTING APPARATUS AND METHOD OF PRODUCING THE SAME

BACKGROUND OF THE INVENTION

1. Field of the Invention

The present invention relates to a light-emitting apparatus in which a plurality of light-emitting devices are allowed to emit light in different directions, and a method of producing the same.

2. Description of the Related Art

Major examples of conventional remote control coordinate indicators are cross-shaped cursor keys or ball pointers of remote controllers. Other major examples include controllers provided with a joy stick and planar coordinate input devices with switches disposed in a matrix arrangement.

The present applicant previously proposed the use of a light-emitting apparatus for the remote control coordinate indicator. In this light-emitting device, a plurality of light-emitting diodes are arranged so as to emit light in different directions. When such a light-emitting apparatus is used, the remote control coordinate indicator allows an operator at a distance to indicate the coordinates by intuitively moving the cursor in space. This type of remote control coordinate indicator has the advantage that it can be used over a wide region and that the detection angle range is wide, since the half value angle of a light-emitting pattern is wider and the light-emitting intensity is larger.

A description will now be given of this type of remote control coordinate indicator, with reference to FIGS. 7 to 12.

FIG. 7 is a schematic view illustrating a remote control coordinate indicator. FIG. 8 is a view illustrating the principle of angle detection of the remote control coordinate indicator. FIGS. 9A, 9B, and 9C are a front view, a side view, and a bottom view, respectively, of an arrangement of light-emitting diodes in a first conventional example of the remote control coordinate indicator. FIG. 10 is a diagram showing angle detection characteristics in the case where the half value angles of the light-emitting diodes of the remote control coordinate indicator have about the same values. FIG. 11 is a view illustrating an arrangement of light-emitting diodes in a second conventional example of the remote control coordinate indicator. FIG. 12 is a front view illustrating an arrangement of light-emitting diodes in a third conventional example of the remote control coordinate indicator.

Referring to FIG. 7, reference numeral 1 denotes a remote control operation member, reference numeral 2 denotes a monitor, reference numeral 3 denotes a controller, and reference numeral 4 denotes a light-receiving element such as a pin photodiode. Using FIG. 7, the coordinate detection and transmission methods of the remote control operation member 1 will be described.

Carrier production (described later) is performed at the remote control operation member 1 side, while an angle is detected by the controller 3. Transmission and reception of infrared light is performed unidirectionally from the remote control operation member 1 to the controller 3. The construction of the operation member 1 comprises five light-emitting diodes. The controller 3 is operated to compute the x and y coordinates of the remote control operation member 1 on the basis of the balance of the intensities of the quantity of infrared light received by one light-receiving element 4 from the remote control operation member 1. The computed x and y coordinate data is transmitted to the monitor 2, whereby a cursor 5 is moved. The transmission signal format of each light-emitting diode ordinarily consists of a remote control 40 kHz carrier portion and a 1–2 modulation signal 16 kHz carrier portion.

A description will now be given of the principle of detecting a uniaxial (for example, x direction) angle in the present invention, with reference to FIG. 8.

The x coordinate approximates angle θ between the optical axis (indicated by alternate long line and short dashed line) and a center line of the remote control operation member 1. The optical axis is formed by a line connecting the remote control operation member 1 and the light-receiving element 4.

The present invention utilizes the optical field of a light-emitting diode (LED). Light-emitting device A emits light, after which light-emitting element B emits light, causing the optical axis to become the point of observation, so that at the light-receiving element 4 the quantity of light emitted by the light-emitting device A and the light-emitting device B are detected in terms of current $I_A$ or $I_B$, respectively. Using these values, the approximate projected x coordinate is found by Formula (1):

$$x = k((I_A - I_B)/(I_A + I_B)) \tag{1}$$

Using this principle, the x and y coordinates are detected. The light-emitting diodes must emit light with a wide half value angle and a high intensity in order to allow light emission for a longer distance and a wider angle. In other words, the half value angle, being the angle at which the intensity of the light-emitting diode is halved, must be wide and the intensity must be high for practical purposes. However, when the half value angle is wide, the radiation intensity decreases. Accordingly, the present invention aims at providing an optical field with a wide half value angle and a high radiation intensity by combining the light-emitting diodes in a particular way, which is described below.

A description will now be given of a first conventional example, with reference to FIGS. 9 and 10.

As in FIG. 9, five light-emitting diodes are arranged so as to form the shape of a cross. More specifically, LED 10C is disposed at the center, LED 10U is disposed facing upward and above the LED 10C, LED 10D is disposed facing downward and below the LED 10C, LED 10R is disposed facing toward the right and to the right of the LED 10C, and LED 10L is disposed facing towad the left and to the left of the LED 10C. The LEDs emit light alternately. For example, the LEDs may emit light such that two sets, such as the LED 10C and the LED 10R, the LED 10C and the LED 10L, and the LED 10C and the LED 10D, alternately emit light. The LED 10C and the LED 10R emit light at the same time for a predetermined period of time, and then the LED 10C and the LED 10L emit light at the same time for a predetermined period of time. Thereafter, the LED 10C and the LED 10U emit light at the same time for a predetermined period of time, and then the LED 10C and the LED 10D emit light for a predetermined period of time. This process is repeated.

In this case, the x coordinate is determined from Formula (2) which is obtained by substituting the current values $I_{C+R}$ and $I_{C+L}$ of the LED 10C and the LED 10R, and of the LED 10C and the LED 10L, respectively, at the observation points into the aforementioned Formula (1):

$$x = k((I_{C+R} - I_{C+L})/(I_{C+R} + I_{C+L})) \tag{2}$$

The y coordinate is determined from Formula (3) which is obtained by substituting the current values $I_{C+U}$ and $I_{C+D}$ of the LED 10C and the LED 10U, and the LED 10C and the LED 10D, respectively, at the observation points into Formula (1):

$$y=k((I_{C+U}-I_{C+D})/(I_{C+U}+I_{C+D}))  \quad (3)$$

The tilting β of each of the LEDs 10U, 10D, 10R, and 10L is set at about the LED half value angle.

FIG. 10 is a diagram illustrating angle detection characteristics in a conventional example, in which the horizontal axis indicates the deflection angle θ of the operation member 1, while the vertical axis indicates the normalized value when the maximum values obtained in Formulas (2) and (3) are 1. When the normalized value is 0, the quantities of light emitted from the left and right light-emitting diodes are the same. As is clear from the diagram, the characteristic curve increases monotonically, meaning that the gradient and the linearity can be adjusted by the light-emission intensity and mounting angle of each LED. A wide mounting angle results in a small gradient, while a narrow mounting angle results in a steeper gradient. When the tilting angle is within the range of from −15 degrees to +15 degrees, the characteristic curve becomes substantially a straight line within this range.

If it is assumed that the size of a common television screen is about 20 to 50 inches, and that the person is about 2 to 3 meters from the television set, the angle at which the person points the operation member to the screen is about ±10 to 15 degrees. Ergonomically speaking, operation can be easily performed at an angle of about −15 degrees to +15 degrees. Therefore, operation is frequently performed at about this angle.

In the foregoing description, when each LED is mounted at about the half value angle, variations occur in the half value angle of each LED, which is very costly to eliminate. Even a small variation in the half value angle of the LED causes the graph to take the form of a wavy curve, as indicated by the dashed line of FIG. 10, resulting in the problem that the cursor moves in a curve on the monitor 2, even when the remote control operation member is moved straight. This is a particularly serious problem at the peripheries of the monitor screen.

When the half value angle of the LED 10C is larger than the half value angle of the outer LEDs, that is when the field of the center LED 10C is wider than those of the outer LEDs, the graph takes the form of a wavy curve as indicated by the dashed line of FIG. 10, resulting in poor linearity.

A description will now be given of a second conventional example, with reference to FIG. 11. Parts which are essentially the same as those of the previous conventional example are given the same reference numerals, and will not be described in detail below.

In the second conventional example, LEDs 10U, 10D, 10C, 10R, and 10L are disposed in a row from the left side, as shown in FIG. 11. Such an arrangement is called linearly independent angle type arrangement. Arranging the LEDs in a row makes the remote control operation member 1 thinner. The way in which the LEDs emit light is essentially the same as the way they emit light in the first conventional example.

A description will now be given of a third conventional example, with reference to FIG. 12. Parts which are essentially the same as those of the previous conventional example are given the same reference numerals, and will not be described below.

In the third conventional example, the LEDs are arranged on the basis of synthesized angles between two orthogonal coordinate axes. Such an arrangement is called a synthesized angle type arrangement. As shown in FIG. 12, LEDs 10LU, 10LD, 10RU, and 10RD are obliquely arranged around a center LED 10C.

The LEDs in the third conventional example may be allowed to emit light such that a set of three LEDs alternately emit light. The sets of three LEDs may be, for example: (1) LEDs 10C, 10LU, and 10LD, (2) LEDs 10C, 10RU, and 10RD, (3) LEDs 10C, 10LU, and 10RU, and (4) LEDs 10C, 10LD, and 10RD. In other words, LEDs 10C, 10LU, and 10LD are allowed to emit light at the same time for a predetermined period of time, and then LEDs 10C, 10RU, and 10RD are allowed to emit light at the same time for a predetermined period of time. Thereafter, LEDs 10C, 10LU, and 10RU are allowed to emit light at the same time for a predetermined period of time, after which LEDs 10C, 10LD, and 10RD are allowed to emit light at the same time for a predetermined period of time. This process is repeated.

In this case, the x coordinate is determined from Formula (4) which is obtained by substituting the current values $I_{C+LU+LD}$ and $I_{C+RU+RD}$ of LEDs 10C, 10LU and 10LD, and LEDs 10C, 10RU, and 10RD, respectively, at the observation points into the aforementioned Formula (1):

$$x=k((I_{C+LU+LD}-I_{C+RU+RD})/(I_{C+LU+LD}+I_{C+RU+RD})) \quad (4)$$

The y coordinate is determined from Formula (5) which is obtained by substituting the current values $I_{C+LU+RU}$ and $I_{C+LD+RD}$ of LEDs C, LU, and RU and LEDs C, LD, and RD, respectively, at the observation points into the aforementioned Formula (1):

$$y=k((I_{C+LU+RU}-I^{C+LD+RD})/(I_{C+LU+RU}+I_{C+LD+RD})) \quad (5)$$

Arrangement of the LEDs as shown in FIG. 12 widens the light-emitting pattern field, and further widens the possible detection area and increases the angle detection range.

The primary factors which reduce the detection range and destroy, for example, the linearity in the light-emitting apparatus are variations in the axes, intensities, and half value angles (or field shapes) of the light-emitting diodes used as light-emitting devices.

A description will now be given of the construction of an LED with reference to FIGS. 13A and 13B which are a schematic front view and a schematic side elevational view, respectively, of the construction of an LED.

The LED 60 is formed by mounting a cup 62 at an end of one of the terminals, terminal 61, such that the opening of the cup faces upward, fixing an LED chip 63 in the cup 62, and connecting a gold leader wire from the LED chip 63 to an end of the other terminal 65. A mold case 66 is formed by molding such that the cup 62 is mounted between the ends of the terminals 61 and 65.

Therefore, variations such as those mentioned above occur due to the position of the LED chip 63 relative to an R surface of the mold case 66, or mounting condition of the cup 62. More specifically, during mounting, the cup 62 may be displaced laterally in the x direction, forwardly or backwardly in the y direction, or in the direction of the height in the z direction. In addition, the cup 62 may tilt laterally in the x direction or forwardly or backwardly in the y direction. Displacements in the x or y direction, or tilting in the x or y direction primarily cause axial variations. Displacements in the z direction primarily cause variations in the half value angles and intensities.

Displacements of the position of the LED chip 63 relative to the R surface of the mold case 66 occurs when the LED chip 63 and the cup 62 are being fixed to each other, and when the LED chip 63 with the cup 62 fixed thereto is being fixed to the mold case 66 resin.

A description will now be given of the LED 60 production process steps, with reference to FIGS. 14A to 14G which are schematic views of the LED 60 production process steps In FIG. 14A, a hoop with a plurality of pairs of terminals 61 and 65 is prepared, and a cup 62 is formed at an end of one of the terminals, terminal 61. Then, as shown in FIG. 14B, a conductive silver paste 67 is filled in the cup 62, and then, as shown in FIG. 14C, an LED chip 63 is placed on the silver paste 67 before the silver paste 67 hardens. The process steps illustrated in FIGS. 14B and 14C are called the die bond process steps. Then, the silver paste 67 is hardened, whereby the LED chip 63 is fixed within the cup 62, after which the wire bond process steps of FIG. 14D is performed in order to connect an end of the leader wire 64 to the LED chip 63, and the other end of the leader wire 64 to the upper end of the terminal 65. Thereafter, the mold process step is performed in order to set the cup 62 facing downward in a mold 68, after which synthetic resin 69 is filled therein, whereby the mold case 66 is formed.

Then, as shown in FIG. 14F, the frame joined to the terminals 61 and 65 is cut off, followed by inspection of the characteristics thereof or the like, and cutting off of the terminals from the frame, whereby an LED 60 illustrated in FIG. 14G is formed.

The LEDs 60 produced in this way are inserted into LED receiving holes 71 formed in an integral frame of FIGS. 15 and 16, and are affixed to the frame with an adhesive, as a result of which a light-emitting apparatus C as that shown in FIG. 7 is formed. (The order of the tilting angles of the LEDs 60 is different from that of the LEDs of FIG. 7.) The receiving holes 71 are formed at predetermined tilting angles in the integral frame 70 so as to allow the LEDs 60 to be mounted at their respective predetermined angles.

FIGS. 15 and 16 are views of the integral frame just before the LEDs 60 are inserted into their respective receiving holes 71 from below the integral frame 70. In the figures, reference numerals 72 denote mold lenses which are formed integral with the integral frame 70 so as to cover the upper portion of the receiving holes 71 in the frame 70. In FIGS. 15 and 16, the surface lines of the mold lenses 72 are drawn to show the surface shapes thereof.

In the above-described production process, displacement of the LED chip 63 relative to the R surface of the mold case 66 is thought to occur when the die bond process steps of FIGS. 14B and 14C are being performed, or most often during the resin hardening process step of FIG. 14E. As can be seen from the figures, it is difficult to achieve positional and angular precision, since the terminal 61 fixed to the LED chip 63 and the terminal 65 are inserted into the mold case 66 filled with synthetic resin 69, and then removed after hardening.

The above-described production process of a LED used for remote control operation (so-called shell-type LED) makes it difficult to reduce these variations. These variations can be reduced by producing a transfer-type LED, but this is very costly.

Consequently, in a light-emitting apparatus in which a plurality of remote control operation LEDs are disposed at predetermined angles, cheap LEDs must always be used, which results in considerable deterioration in the performance of the apparatus due to LED variations, so that, at present, attempts are being made to reduce the variations by a lens cap, aventurine means, or the like.

SUMMARY OF THE INVENTION

Accordingly, a first object of the present invention is to provide a light emitting apparatus which reduces variations in the directional characteristics of a light-emitting device, and causes displacement of light-emitting device chips, if it occurs, to be unidirectional, that is variations to be directional, so that adjustments are not required, and the detection range and the linearity are stabilized; and a method of producing the same.

A second object of the present invention is to provide a light-emitting apparatus, in which the terminals project so as to form a row from the back side of a base, thus facilitating subsequent handling thereof, and making it possible to prevent connection errors or the like; and a method of producing the same.

A third object of the present invention is to provide a light-emitting apparatus, in which the terminals project so as to form one row from the back side of a base in order to reduce the length of the device in the direction of the height (thickness) and thus make the device thinner; and a method of producing the same.

According to a first form of the present invention, the first object is achieved by a light-emitting apparatus, comprising at least three light-emitting devices; and a base; wherein the base and the at least three light-emitting devices are integrally formed by molding, with the at least three light-emitting devices kept at different angles.

According to second form of the present invention, the first object is achieved by a method of producing a light-emitting apparatus, comprising: a die bond step in which a light-emitting device chip tilted at a predetermined angle is affixed to one of the terminals of each of at least three terminal groups with a conductive paste; a wire bond step in which each of the light-emitting device chip affixed to the one of the terminals is connected to the other terminal via a connecting wire; and a molding step in which each of the light-emitting device chip is integrally formed with a mold case by molding so as to be embedded in the mold case.

According to a third form of the present invention, the second object is achieved by a light-emitting apparatus, wherein the light-emitting devices formed integrally with the base are disposed in a row.

According to a fourth form of the present invention, the second object is achieved by a method of producing a light-emitting apparatus, wherein the light-emitting devices formed by molding are arranged in a row.

According to a fifth form of the present invention, the third object is achieved by a light-emitting apparatus, wherein the light-emitting devices formed integrally with the base are arranged in one row.

According to a sixth form of the present invention, the third object is achieved by a method of producing a light-emitting apparatus, wherein the light-emitting devices formed by molding are arranged in one row.

According to the aforementioned first and second forms of the present invention, light-emitting chips are formed integral with the frame at the same time, thus making it possible to provide a light-emitting apparatus in which variations in directional characteristics of a light-emitting device are reduced and detection range and linearity are stabilized. In addition, even if the light-emitting device chips are displaced, the displacements of the light-emitting chips are unidirectional. Consequently, since the variations are made directional so that the variations are mutually absorbed, variations are reduced, thus making adjustments very easy to carry out.

According to the aforementioned third and fourth forms of the present invention, the terminals project so as to form a row from the back side of the base, thus facilitating subsequent handling thereof, and preventing erroneous connections.

According to the aforementioned fifth and sixth forms of the present invention, the terminals project so as to form one row from the back side of the base, thus reducing the length in the direction of the height (thickness) of the apparatus and thus making the apparatus thinner.

BRIEF DESCRIPTION OF THE DRAWINGS

FIGS. 4A to 4D are views illustrating production process steps of the light-emitting apparatus.

FIGS. 14A to 14G are schematic views illustrating the steps of producing a conventional light-emitting diode.

DESCRIPTION OF THE PREFERRED EMBODIMENT

A description will now be given of a preferred embodiment of the present invention with reference to the drawings.

Figure 1:
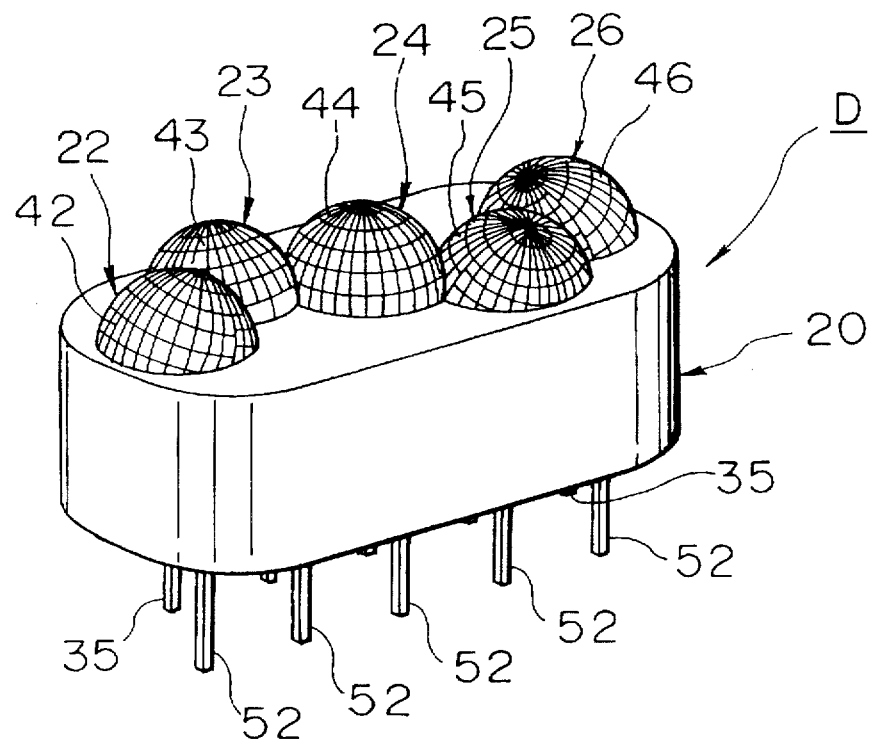
FIG. 1 is a perspective view of an embodiment of a light-emitting apparatus in accordance with the present invention.
Figure 2:
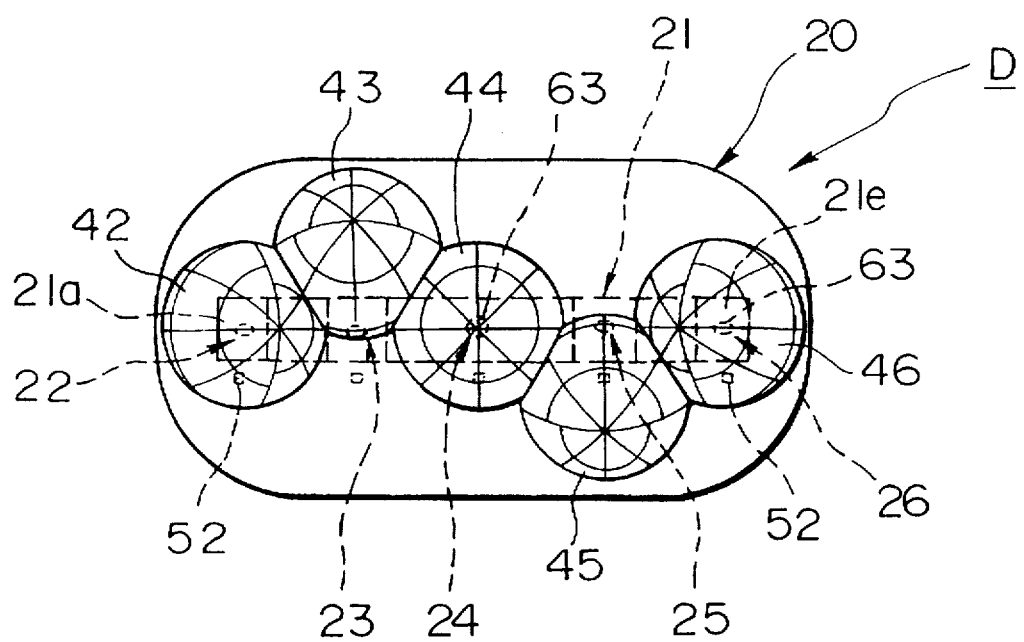
FIG. 2 is a plan view of FIG. 1.
Figure 3:
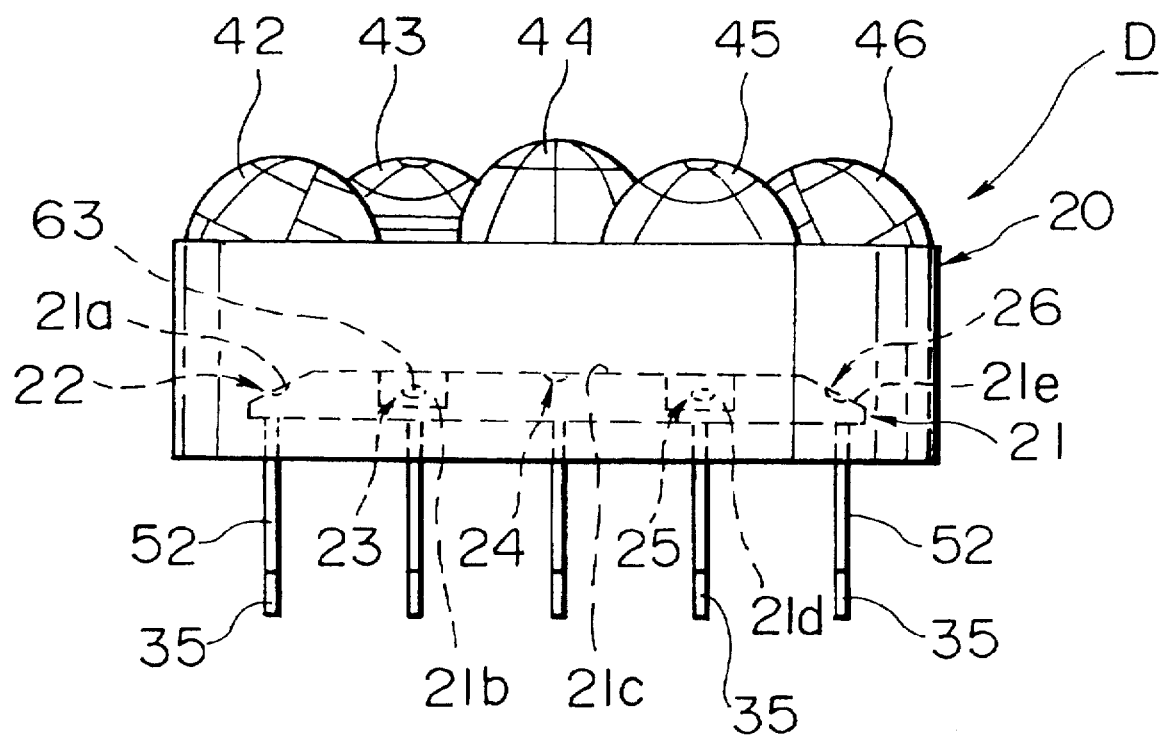
FIG. 3 is a front elevational view of FIG. 1.
Figure 5A:
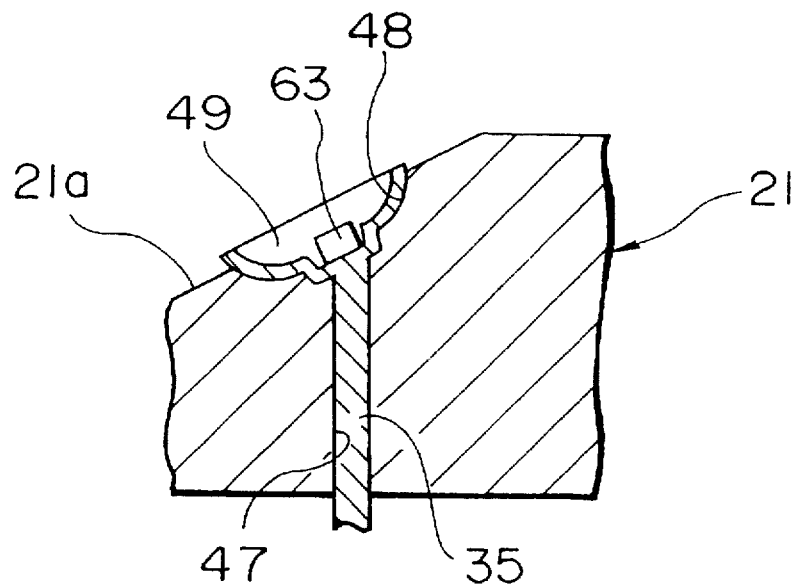
FIGS. 5A and 5B are an enlarged section of the critical portion of FIG. 4C and a section of another example of the critical portion of FIG. 4C.
Figure 5B:
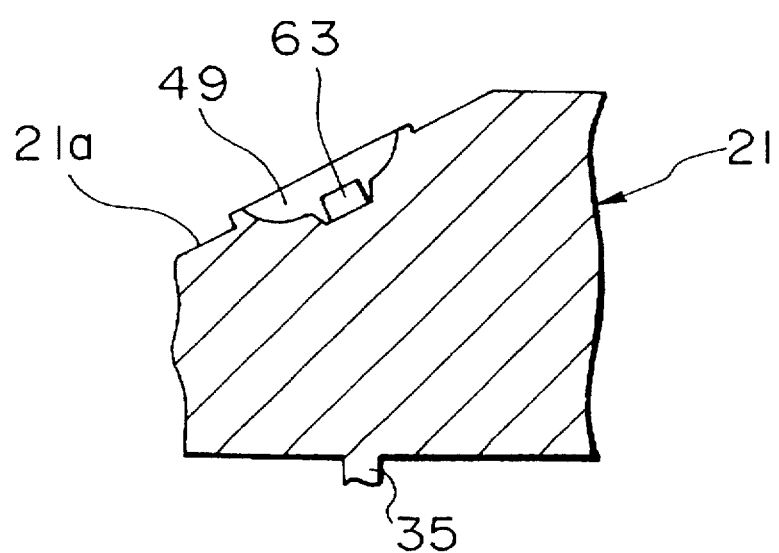
Figure 6:
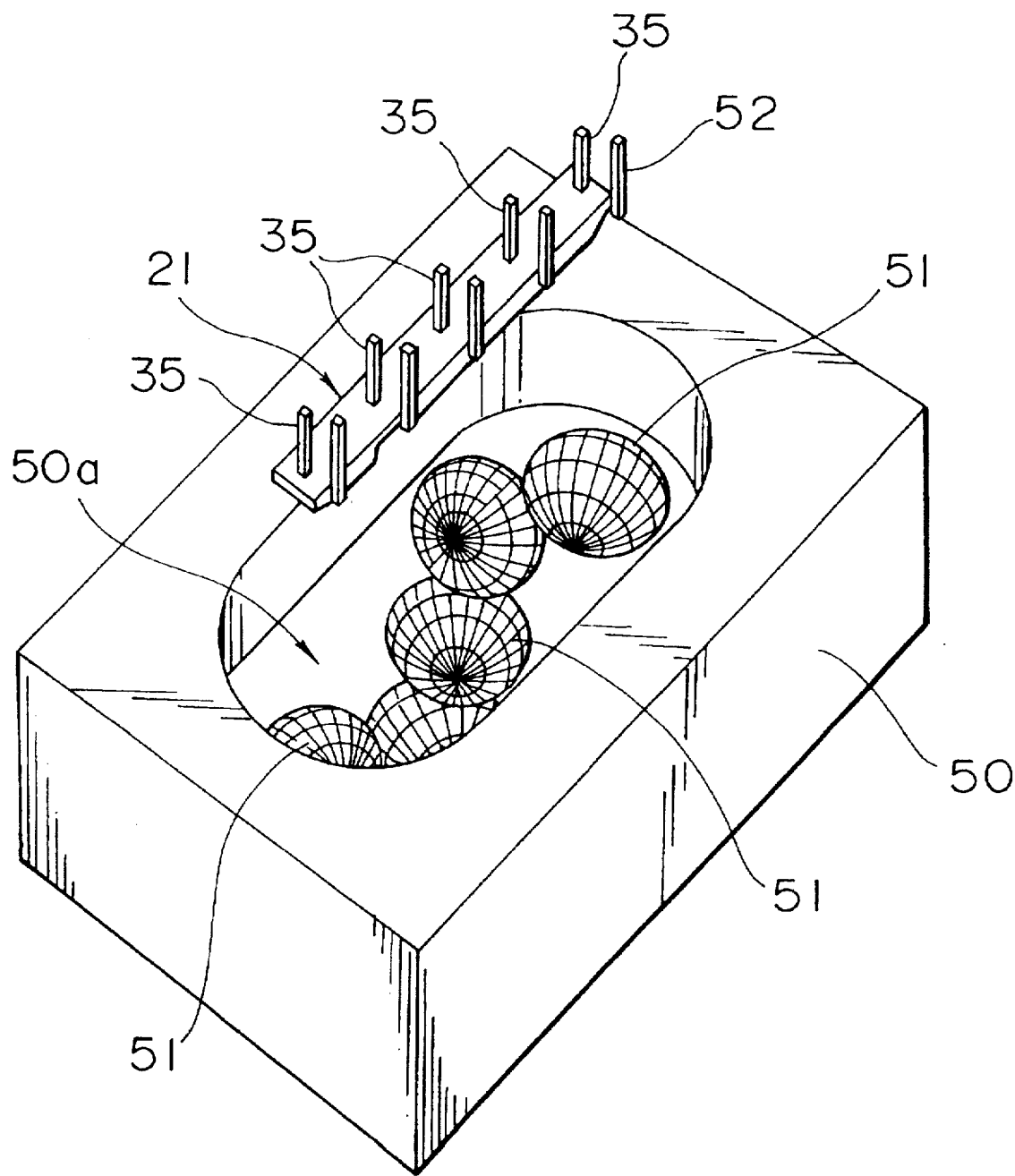
FIG. 6 is a view illustrating a production process step of the light-emitting apparatus.
Figure 7:
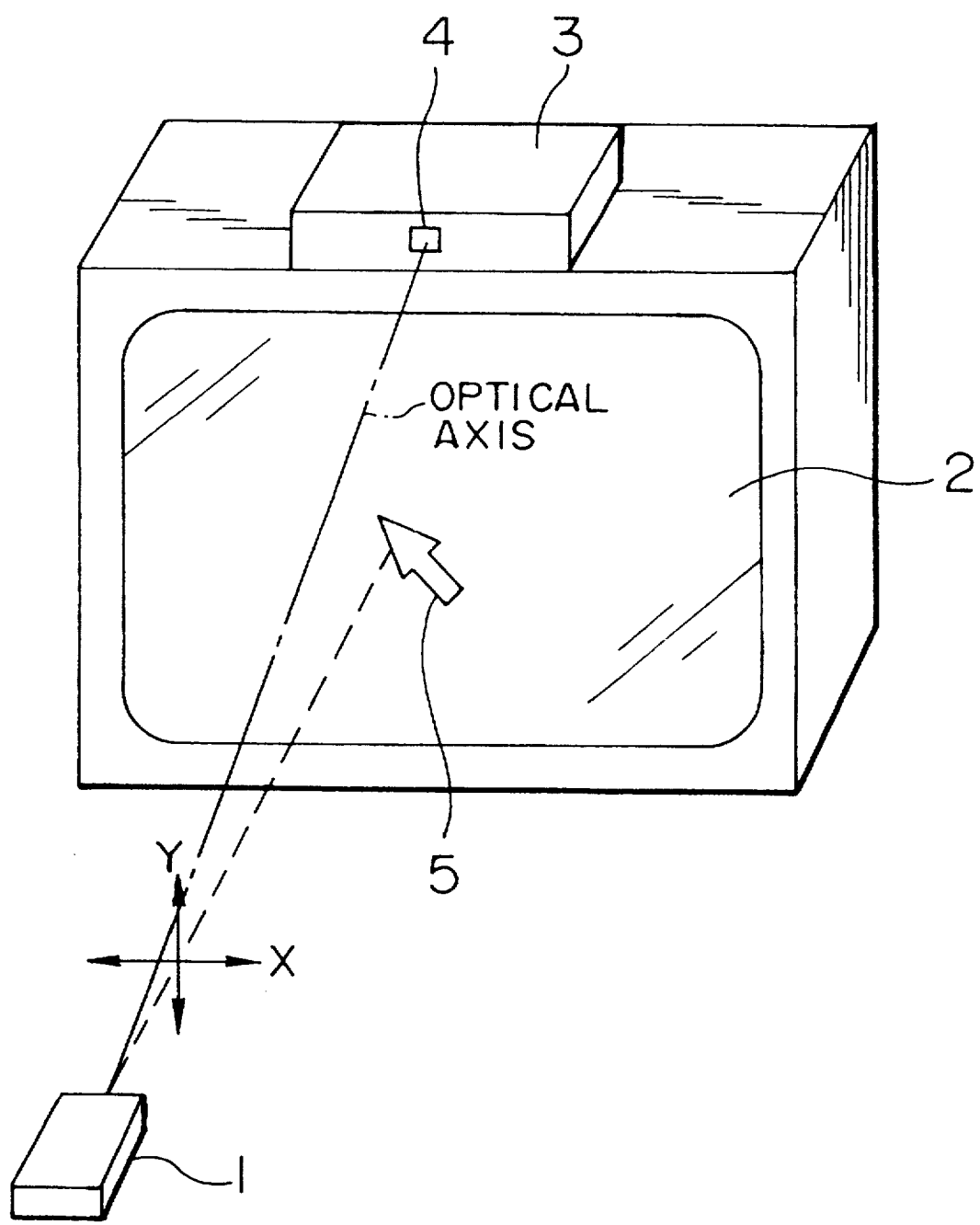
FIG. 7 is a schematic view illustrating a remote control coordinate indicator.
Figure 8:
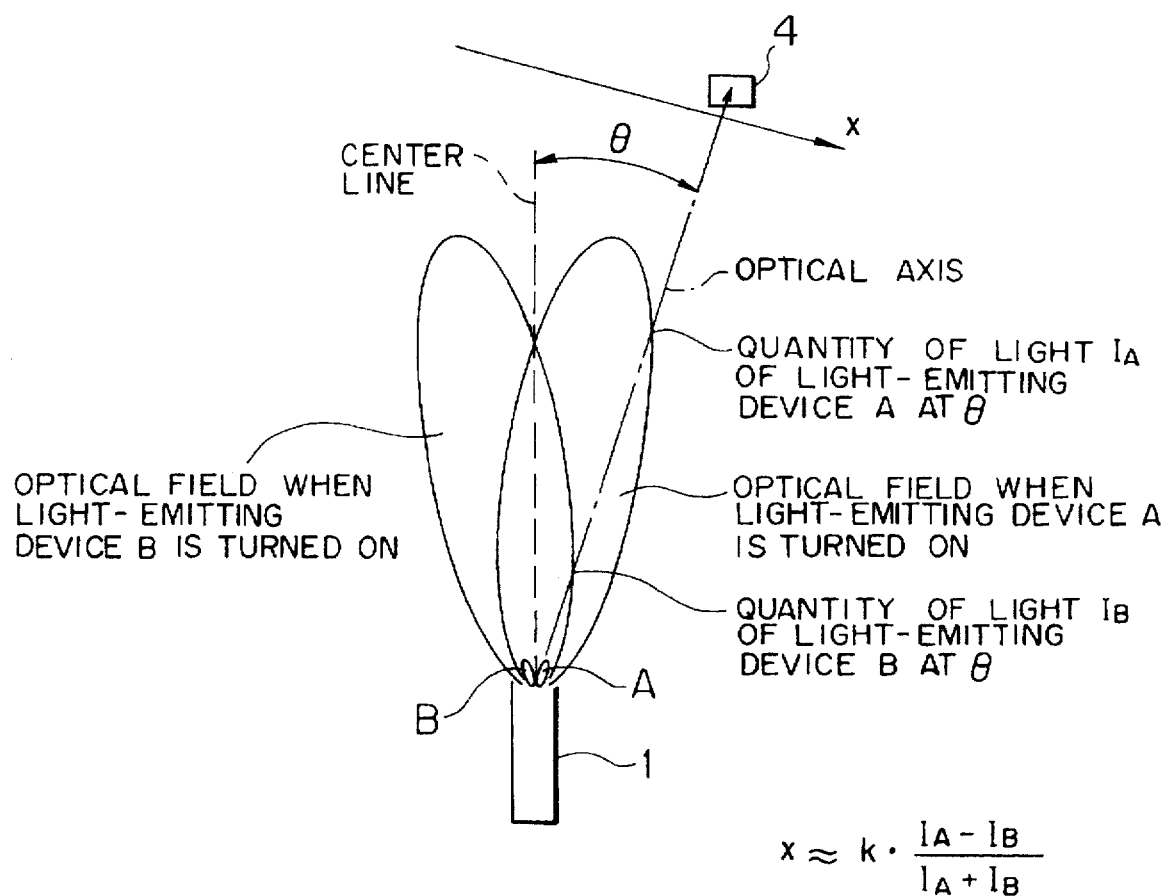
FIG. 8 is a view illustrating the principle of angular detection of the remote control coordinate indicator.
Figure 9A:
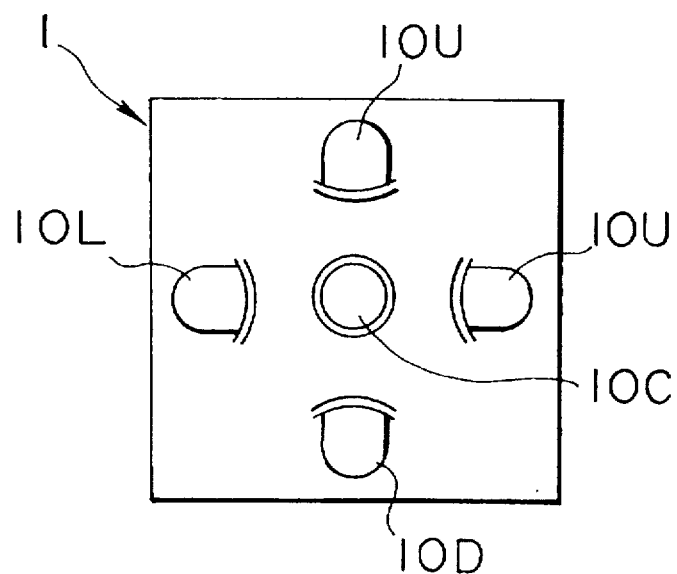
FIGS. 9A, 9B, and 9C are a front view, a side view, and a bottom view, respectively, of an arrangement of light-emitting diode in a first conventional example of the remote control coordinate indicator.
Figure 9B:
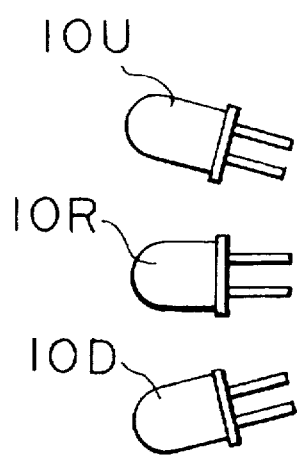
Figure 9C:
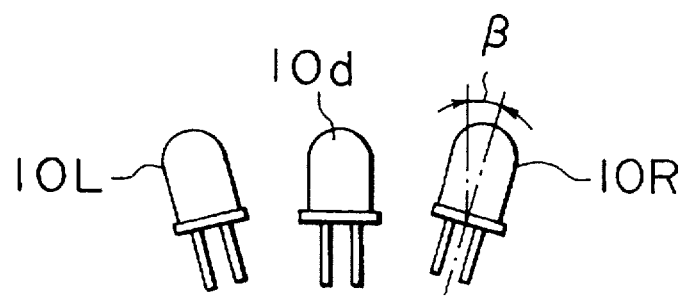
Figure 10:
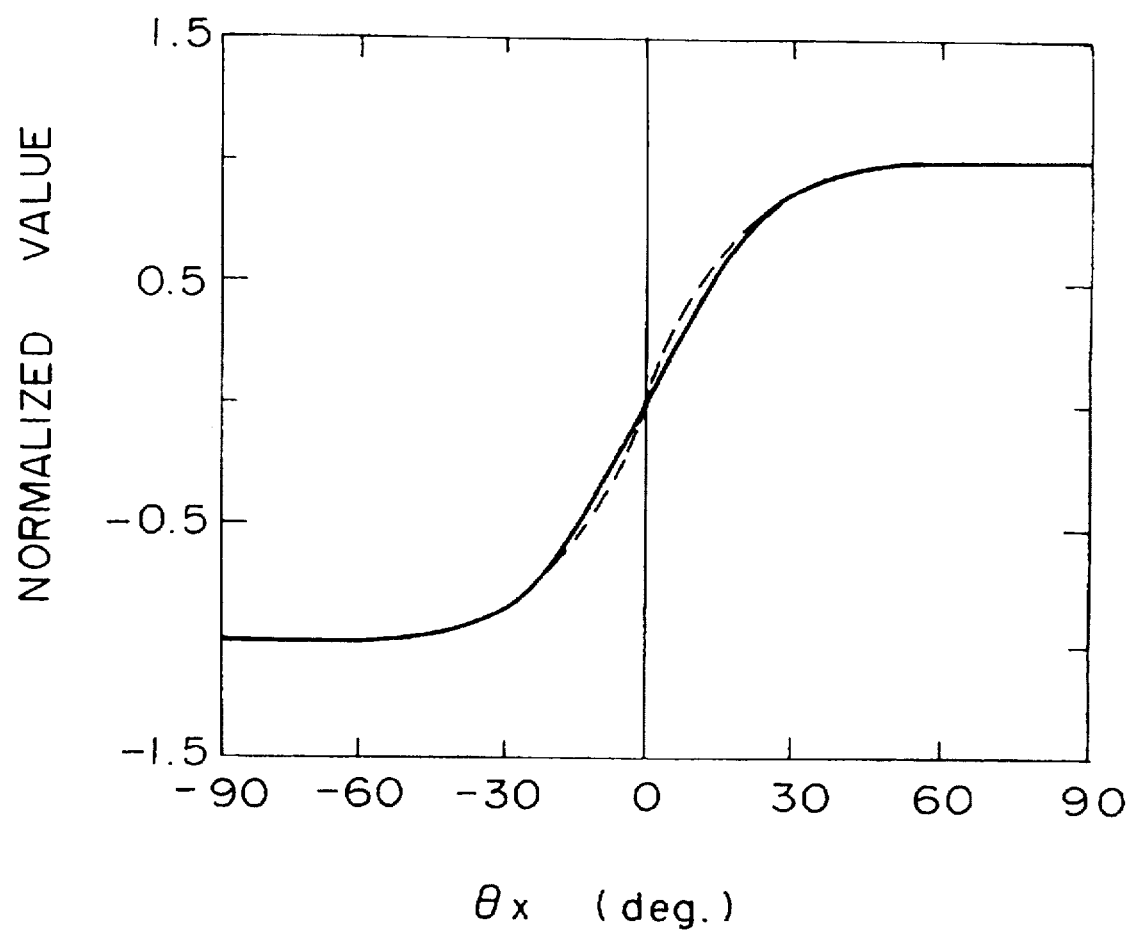
FIG. 10 is a diagram showing detection angle characteristics in the case where the half value angles of the light-emitting diodes of the remote control coordinate indicator have about the same values.
Figure 11:
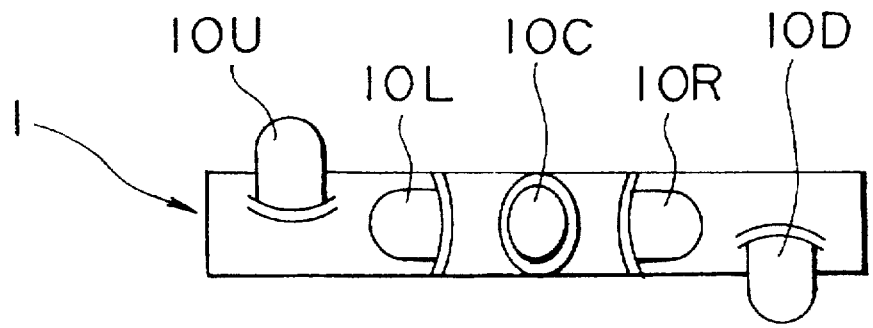
FIG. 11 is a view illustrating an arrangement of light-emitting diodes in a second conventional example of the remote control coordinate indicator.
Figure 12:
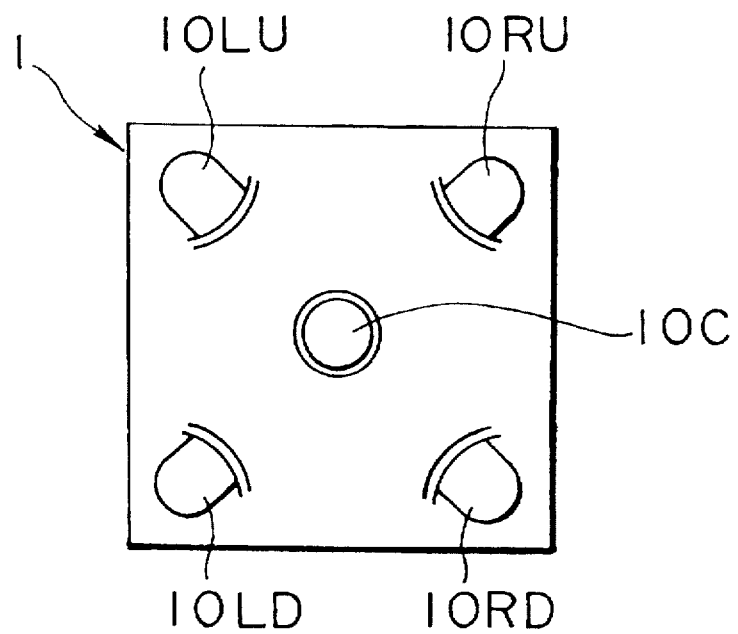
FIG. 12 is a front view illustrating an arrangement of light-emitting diodes in a third conventional example of the remote control coordinate indicator.
Figure 13A:
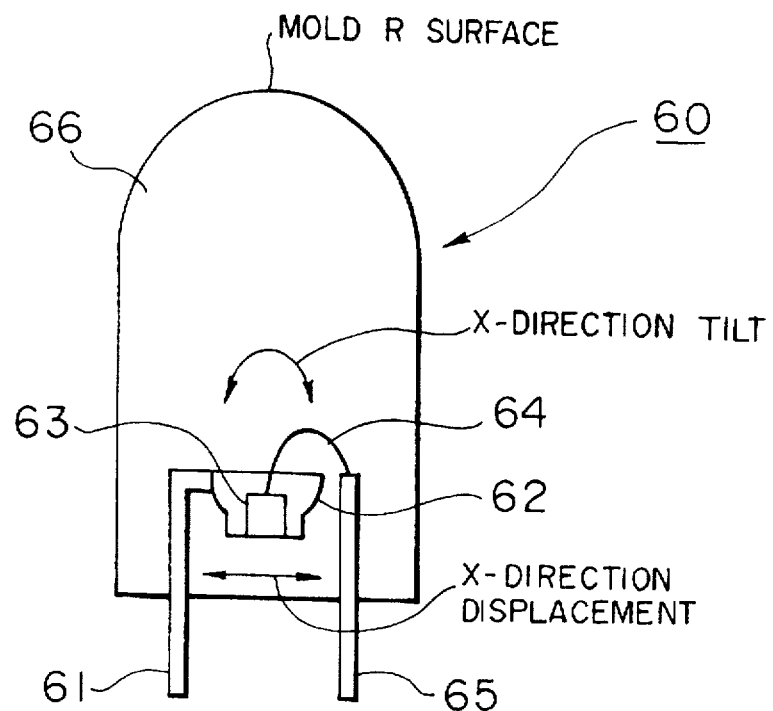
FIGS. 13A and 13B are a schematic front elevational view and a schematic side elevational view, respectively, of a construction of a conventional light-emitting diode.
Figure 13B:
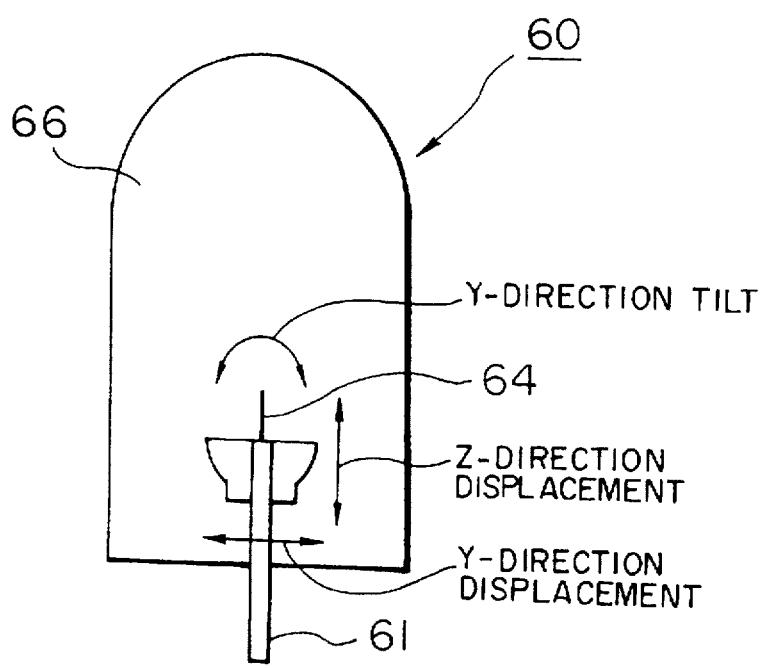
Figure 15:
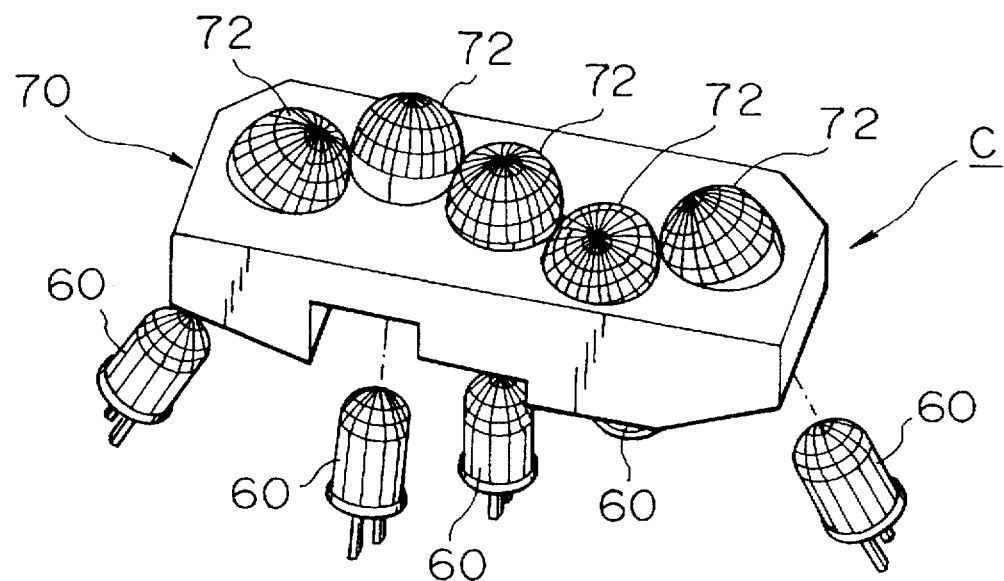
FIG. 15 is a perspective view, as seen from above, of a conventional frame just before integral insertion of each light-emitting diode into a corresponding diode receiving hole from below the frame.
Figure 16:
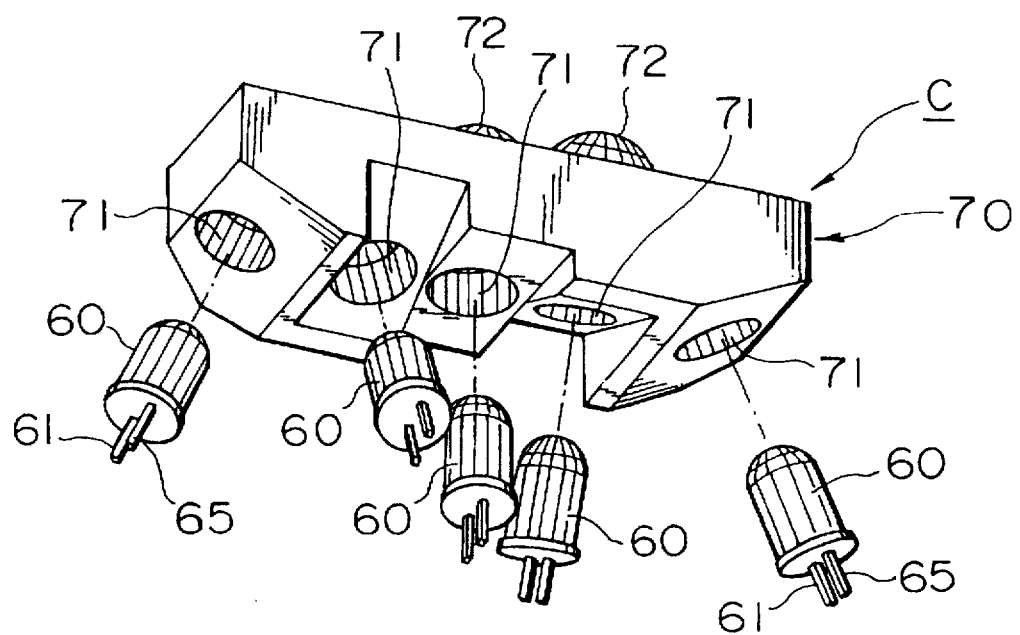
FIG. 16 is a perspective view, as seen from below, of the conventional frame just before integral insertion of each light-emitting diode into the corresponding diode receiving hole from below the frame.

FIG. 1 is a perspective view of an embodiment of a light-emitting device in accordance with the present invention. FIG. 2 is a plan view of FIG. 1. FIG. 3 is a front elevational view of FIG. 1. FIGS. 4A to 4D are views illustrating the steps of producing the light-emitting apparatus. FIGS. 5A and 5B are an enlarged section of the critical portion of FIG. 4C and a section of another example of the critical portion of FIG. 4C. FIG. 6 is a view illustrating a production process step of the light-emitting apparatus.

As shown in FIGS. 1 to 3, the light-emitting apparatus D of the present embodiment comprises a mold case 20, a base 21 which is an elongated conductive member embedded in the mold case 20, and five LED sections 22 to 26 mounted onto the front side of the base 21 and spaced apart from each other. Each LED section 22 to 26 is disposed with its optical axis set at the predetermined angle as described above. Mold lenses 42 to 46 are integrally formed by molding at the upper side portions of the mold case in correspondence with the optical axis of their respective LED sections 22 to 26. A pair of terminals 35 and 52 of each LED section 22 to 26 project from the lower surface of the mold case 20.

As shown in FIGS. 2 to FIGS. 4A to 4D, there are five planar surface sections 21a to 21e which extend in different directions, or in a direction perpendicular to the optical axis of the corresponding LED section. More specifically, as shown in FIGS. 4A to 4D, starting from the backmost planar surface section, the planar surface section 21a inclines backward, the planar 21b inclines toward the right, the planar surface section 21c is not inclined, the planar surface section 21d inclines toward the left, and the planar surface section 21e inclines toward the front. As shown in FIG. 5A, receiving holes 47 which receive the terminals 35 of the LED sections pass through their respective planar sections 21a to 21e along predetermined optical axes. Spherical recesses 48 are formed at the opening edges at the planar surface section side of the receiving holes 47, with a cup 49 formed on the upper end of the terminal 35 disposed in each recess 48. The direction toward which the cup 49 is formed on each terminal 35 faces is determined in correspondence with the predetermined optical axis of each LED section 22 to 26.

The terminal 35 and the terminal 52 form a pair of terminals for each LED section 22 to 26. Each pair of the terminals 35 and 52 are joined as hoop members until they are formed integrally with the mold case 20 (not shown in FIGS. 4 to 6) by molding.

A silver conductive paste 67 or the like is applied to the cup 49 formed on each terminal 35 formed at the planar sections 21a to 21e, and a LED chip 63 is placed and fixed onto the paste 67 applied to each cup 49. Each LED chip 63 is electrically connected to its corresponding terminal 52 through an Au wire 64.

Although in the foregoing description, the base 21 and the terminals 35 are separate component parts, the base 21, the terminals 35, and the cups 49 may be integrally formed using conductive material, as shown in FIG. 5B. In the constructions shown in FIGS. 5A and 5B, the terminals 52 are insulated from each other by the mold case 20, so that a signal can be transmitted from the terminals 52 to control their respective LED sections 22 to 26.

In the light-emitting apparatus D having the above-described construction, each LED chip 63 is mounted to the corresponding cup 49 formed on each terminal 35 and at a previously determined angle on the base 21 in order to form the LED sections 22 to 26, so that even if displacements of the LED sections 22 to 26 occur, the displacements of the LED chips 63 of the LED sections 22 to 26 are all unidirectional. When the displacements are made directional, variations are mutually absorbed, so that displacement of the LED sections is no longer a problem. The remaining relative variations of the LED chips 63 are easily eliminated, since mechanical precision can be easily achieved when mounting the LED chips 63 to the base 21, and the frame can be easily disposed at a particular angle with mechanical precision. In addition, since the terminals 35 as well as the terminals 52 project so as to form a row of terminals 35 and terminals 52, respectively, they are subsequently easy to handle, and erroneous connections are prevented.

A description will now be given of the method of producing the light-emitting apparatus D having the above-described construction.

The cup 49 is formed with a predetermined inclination on the upper end of, for example, each of the five terminals 35, among the loop-like terminals 35 and 52. Then, as shown in FIG. 4A, out-sert molding is performed in order to integrally form the predetermined number of terminals 35, among the loop-like terminals 35 and 52, with the base 21. With the base 21 and the terminals 35 integrally formed, planar surface sections 21a to 21e are formed in correspondence with the inclination of the corresponding cup 49 so as to expose the upper side of each cup 49.

Then, as shown in FIG. 4B, the silver paste 67 is applied to each cup 49, followed by the die bond process shown in FIG. 4C in which each LED chip 63 is placed on the corresponding cup 49. Thereafter, as shown in FIG. 4D, the wire bond process step is performed in order to electrically connect each LED chip 63 to the corresponding terminal 52 by means of Au wire 64.

In FIG. 4D, the LED chips 63 and the terminal 35 and 52 of their respective LED sections 22 to 26 are integrally fixed to the base 21. The base 21, after the wire bond process, is set in a predetermined location in the mold 50 of FIG. 6. The mold 50 has a cavity 50a which forms the external shape of the mold case 20 of FIG. 1, and recesses 51 used to form the mold lenses 42 to 46 by molding. Synthetic resin is filled in the mold 50 in order to form the mold case 20 so as to first surround the base 21 and the lower surface of the base 21 from where the terminals 35 and 52 project. At the end, the joining portions of the terminals 35 and 52 are cut, whereby the light-emitting apparatus D of FIGS. 1 to 3 is formed.

In the method of producing the light-emitting apparatus of the present invention, the conventional die bond, wire bond, or mold process steps may be performed, so that the conventional production line can be utilized. Therefore, it is possible to produce a light-emitting apparatus D which has reduced variations in the directional characteristics, and stabilized detection range and linearity, without having to make considerable changes in the production method.

In the foregoing description, although the LED sections have been described as being arranged in one row, it is obvious that the LED sections may be arranged as the LED sections of the light-emitting apparatus described using FIGS. 9A to 9C, and 10. When, for example, the terminals project so as to form one row from the back side of the base, the length of the device in the direction of the height (thickness) is decreased, thus making the device thinner.

According to the first and second forms of the present invention, it is possible to reduce variations in the directional characteristics of each light-emitting device, and cause displacement of the light-emitting device chips to occur in one direction, that is cause the variations to be directional, so that no adjustments are required, and detection range and the linearity are stabilized.

According to the third and fourth forms of the present invention, the terminals project so as to form a row from the back side of the base, thereby facilitating subsequent handling thereof, and preventing erroneous connections.

According to the fifth and sixth forms of the present invention, the terminals project so as to form one row from the back side of the base, thereby reducing the length of the device in the direction of the height (thickness), and thus making the device thinner.

What is claimed is:

1. A light-emitting apparatus, comprising:

a common base including a plurality of planar surface sections, at least two of the planar surface sections being oriented in different directional optical axes and a first group of terminals having light-emitting device chips positioned and fixed under the planar surface sections;

a second group of terminals respectively connected to each of said light-emitting device chips; and a mold case having said common base and a part of the second group of terminals buried with resin to enclose an entire said light-emitting device chips.

2. A method of producing a light-emitting apparatus, comprising:

a die bond step in which at least three of first groups of terminals are arranged at a common base and each of light-emitting device chips is fixed by conductive paste to end sections of said first groups of terminals;

a wire bond step in which each of said light-emitting device chips and the second terminal are connected via a connecting wire to a second terminal; and a molding step in which said base is positioned within a cavity of a mold in such a way that the other ends of said first groups of terminals may be projected out of the mold and the other ends of said second groups of terminals may be projected out of the mold, resin is filled in said cavity to make an integral mold forming of said base and said second groups of terminals.

3. A light-emitting apparatus according to claim 1, wherein said light-emitting device chips formed integrally with said base are disposed in a row.

4. A method of producing a light-emitting apparatus according to claim 2, wherein said light-emitting device chips formed by molding are arranged in a row.

5. A light-emitting device according to claim 1, wherein said light-emitting device chips formed integrally with said base are arranged in one row.

6. A method of producing a light-emitting apparatus according to claim 2, wherein said light-emitting device chips formed by molding are arranged in one row.

7. A light-emitting apparatus according to claim 1, wherein said planar surface sections of said common base are inclined in such a way that the optical axes may be directed toward at least four directions of upward, downward, leftward and rightward directions and an inclination angle of each of the optical axes is set to about a half-value angle to each other through the inclinations.

8. A light-emitting apparatus according to claim 1, wherein a front surface of said mold case has mold lenses having a central axis extending along an optical axis of each of said light-emitting device chips and said mold case and said mold lenses are filled with resin.

9. A light-emitting apparatus according to claim 1, wherein said common base is formed of conductive material to act as a part of said first group of terminals, and said second group of terminals and said common base are insulated by mold resin.

* * * * *